United States Patent
Jacobson et al.

(10) Patent No.: US 7,360,134 B1
(45) Date of Patent: Apr. 15, 2008

(54) CENTRALIZED BIST ENGINE FOR TESTING ON-CHIP MEMORY STRUCTURES

(75) Inventors: Quinn A. Jacobson, Sunnyvale, CA (US); Parulkat Ishwardutt, San Francisco, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 118 days.

(21) Appl. No.: 11/229,247

(22) Filed: Sep. 16, 2005
(Under 37 CFR 1.47)

Related U.S. Application Data

(60) Provisional application No. 60/612,191, filed on Sep. 21, 2004.

(51) Int. Cl.
*G01R 31/28* (2006.01)
*G06F 11/00* (2006.01)

(52) U.S. Cl. .......................... 714/733; 714/30
(58) Field of Classification Search ............... None
See application file for complete search history.

(56) References Cited

U.S. PATENT DOCUMENTS

| | | | |
|---|---|---|---|
| 5,173,906 A * | 12/1992 | Dreibelbis et al. ........... 714/733 |
| 5,535,164 A * | 7/1996 | Adams et al. ............... 365/201 |
| 5,553,082 A * | 9/1996 | Connor et al. ............... 714/733 |
| 6,044,481 A * | 3/2000 | Kornachuk et al. ......... 714/724 |
| 6,351,789 B1 * | 2/2002 | Green ........................ 711/128 |
| 6,374,370 B1 * | 4/2002 | Bockhaus et al. ............ 714/39 |
| 6,590,907 B1 * | 7/2003 | Jones et al. .................. 370/489 |
| 6,598,177 B1 * | 7/2003 | Jones et al. ................... 714/30 |
| 6,651,202 B1 * | 11/2003 | Phan ........................... 714/733 |
| 6,728,916 B2 * | 4/2004 | Chen et al. ................. 714/733 |
| 7,149,924 B1 * | 12/2006 | Zorian et al. .................. 714/30 |

* cited by examiner

*Primary Examiner*—Phung M. Chung
(74) *Attorney, Agent, or Firm*—Park, Vaughan & Fleming, LLP

(57) ABSTRACT

One embodiment of the present invention provides a system that uses a single built-in-self-test (BIST) engine to test multiple on-chip memory structures. During chip-test or power-on-self-test in the system, the BIST engine tests multiple on-chip memory structures which reside at different locations on the chip. During this testing process, the BIST engine performs at-speed data-parallel testing operations for the multiple on-chip memory structures. In doing so, the BIST engine communicates with the multiple on-chip memory structures through data paths which are used for other purposes during normal operation of the chip, but which are used for communications between the BIST engine and the multiple on-chip memory structures during the testing process.

20 Claims, 3 Drawing Sheets

REQUEST PACKET 200

| | |
|---|---|
| STRUCTURE | 202 |
| SUBARRAY | 204 |
| ENTRY | 206 |
| OPERATION(RD/WR) | 208 |
| DATA (IF WRITE) | 209 |

FIG. 2A

RETURN PACKET 210

| | |
|---|---|
| STRUCTURE | 212 |
| SUBARRAY | 214 |
| ENTRY | 216 |
| OPERATION(RD/WR) | 218 |
| RETURN DATA (ACK IF WRITE) | 219 |

CENTRALIZED BIST ENGINE FOR TESTING ON-CHIP MEMORY STRUCTURES

RELATED APPLICATION

This application hereby claims priority under 35 U.S.C. section 119 to U.S. Provisional Patent Application No. 60/612,191, filed on 21 Sep. 2004, entitled "Centralized BIST Engine for Testing On-Chip Memory Structures," by inventors Quinn A. Jacobson and Parulkar Ishwardutt.

BACKGROUND

1. Field of the Invention

The present invention relates to techniques for improving the test quality of semiconductor chips at a low silicon area cost. More specifically, the present invention relates to a method and an apparatus that comprises a centralized on-chip built-in self-test (BIST) engine to test multiple on-chip memory structures.

2. Related Art

Recent advances in integrated circuit technology have largely been accomplished by decreasing the feature size of circuit elements on a semiconductor chip. This decreasing feature size makes it possible to incorporate increasingly more circuitry into a single semiconductor chip. This has enabled processor designers to incorporate multiple processor cores into a single microprocessor chip.

Unfortunately, as these microprocessor chips become increasingly more complicated, it is becoming harder to test all of the structures in a microprocessor chip. Logic circuitry and flip-flops within a microprocessor chip can be tested using scan techniques and automatic test pattern generation (ATPG). However, scan techniques cannot adequately test on-chip memory structures, such as cache memories or translation-lookaside buffers (TLBs).

For testing on-chip structures, a sequence of read and write operations in a specific addressing sequence is required to test for failure modes. Such control logic that generates this sequence and checks the results is typically designed to test memory structures. This control logic is referred to as "MBIST" engines in the literature. A BIST engine is a finite state machine, which is located in close proximity to a memory structure and is configured to perform successive read and write operations to the memory structure to test the memory structure. However, as more and more memory structures, such as TLBs and Branch History Tables (BHTs), are incorporated into microprocessor chips, it is becoming impractical to provide a separate BIST engine for each of these memory structures.

Hence, what is needed is a method and an apparatus for testing multiple on-chip memory structures without the area overhead of multiple BIST engines

SUMMARY

One embodiment of the present invention provides a system that uses a single built-in-self-test (BIST) engine to test multiple on-chip memory structures. During chip-test or power-on-self-test in the system, the BIST engine tests multiple on-chip memory structures which reside at different locations on the chip. During this testing process, the BIST engine performs at-speed data-parallel testing operations for the multiple on-chip memory structures. In doing so, the BIST engine communicates with the multiple on-chip memory structures through data paths which are used for other purposes during normal operation of the chip, but which are used for communications between the BIST engine and the multiple on-chip memory structures during the testing process.

In a variation on this embodiment, the system uses an external service processor to program the BIST engine to test the multiple on-chip memory structures, wherein programming the BIST engine involves setting configuration registers for the BIST engine.

In a variation on this embodiment, the at-speed data-parallel testing operations involve: writing a data pattern to a location in an memory structure; reading the data pattern from the location in the memory structure; and comparing the data pattern read from the location with the data pattern written to the location to determine if an error took place while writing to or reading from the location.

In a variation on this embodiment, the multiple on-chip memory structures can include: an instruction cache; a data cache; a combined instruction and data cache; a translation-lookaside buffer (TLB); an instruction queue; a branch history table (BHT); and a memory structure containing speculative state information, register files, FIFOs, history buffers and other storage structures.

In a variation on this embodiment, the BIST engine is a state machine that performs read and write operations to the multiple on-chip memory structures.

BRIEF DESCRIPTION OF THE FIGURES

FIG. 2A illustrates the structure of a request packet in accordance with an embodiment of the present invention.

FIG. 2B illustrates the structure of a return packet in accordance with an embodiment of the present invention.

FIG. 3A illustrates exemplary test patterns for testing memory structures in accordance with an embodiment of the present invention.

FIG. 3B illustrates exemplary sequences of memory operations for testing memory structures in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

BIST Engine

Figure 1:
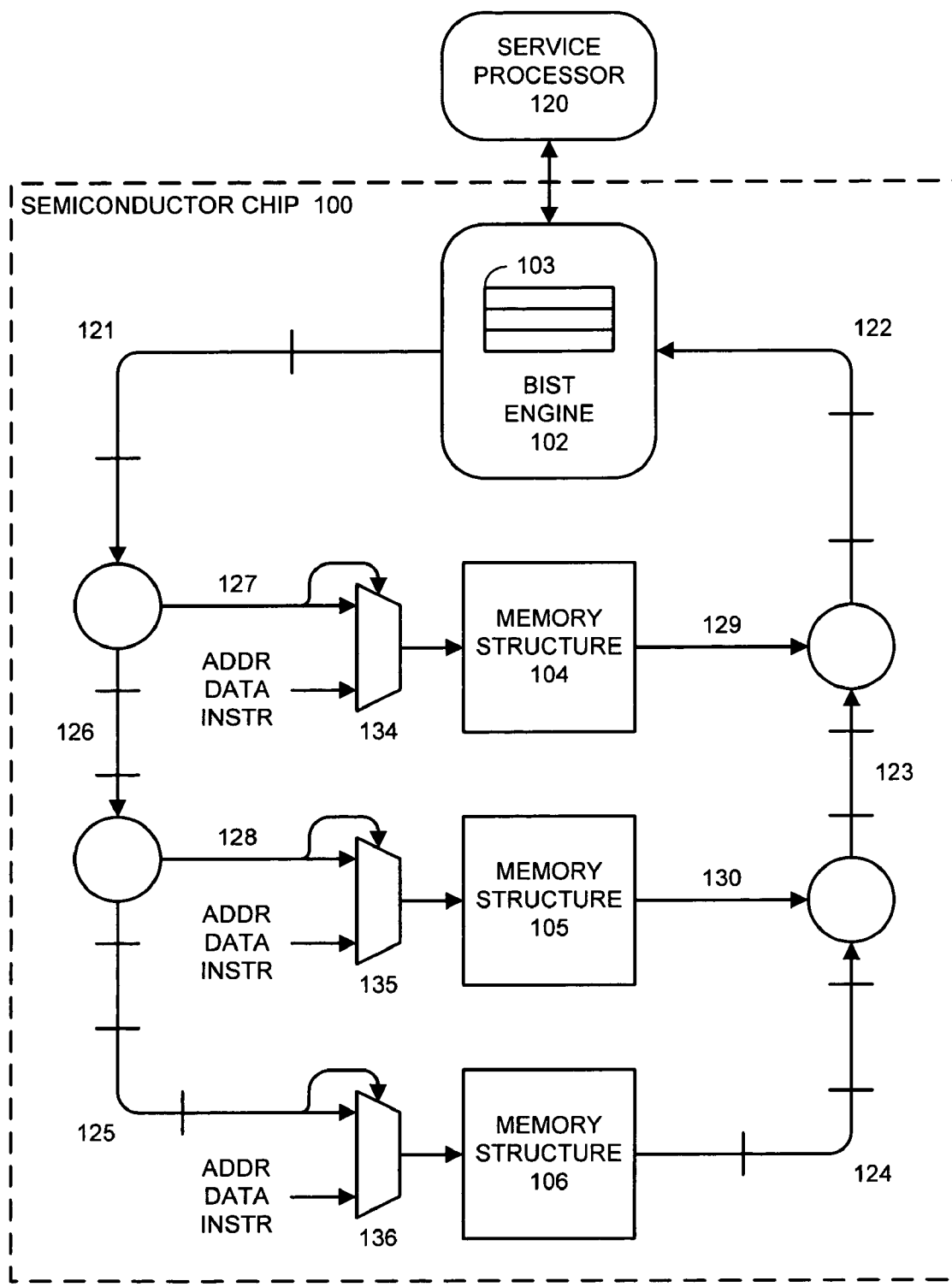
FIG. 1 illustrates a BIST engine which is coupled to memory structures in a semiconductor chip as well as to an off-chip service processor in accordance with an embodiment of the present invention.

FIG. 1 illustrates a BIST engine 102 which is coupled to memory structures 104-106 in a semiconductor chip 100 as well as to an off-chip service processor 120 in accordance with an embodiment of the present invention.

In general, semiconductor chip 100 can include any type of semiconductor chip which contains multiple on-chip memory structures 104-106. However, in one embodiment of the present invention, semiconductor chip 100 is a microprocessor chip with multiple processor cores. In this embodiment, and the on-chip memory structures can include: an instruction cache; a data cache; a combined instruction and data cache; a translation-lookaside buffer (TLB); an instruction queue; a branch history table (BHT); and any memory structure containing speculative state information, register files, FIFOs, history buffers and other storage structures.

In one embodiment of the present invention, BIST engine 120 is a state machine that is configured to perform read and write operations to test multiple memory structures within semiconductor chip 100.

In the embodiment of the present invention illustrated in FIG. 1, BIST engine 102 communicates with an external service processor 120, which programs BIST engine 102 by writing to configuration registers 103. In an alternative embodiment of the invention, BIST engine 102 is pre-programmed to test the multiple memory structures 104-106.

During the initial testing process for semiconductor chip 100, BIST engine 102 is configured to communicate with memory structures 104-106 through a number of data paths 121-130. In one embodiment of the present invention, these data paths are pre-existing data paths that are used for other purposes during normal operation of the chip, but which are used for communications between the BIST engine 102 and the multiple on-chip memory structures 104-106 during the testing process. By using these pre-exiting data paths (with possibly a few additional small segments of connectivity), BIST engine 102 can communicate with memory structures 104-106 (which reside at different locations on semiconductor chip 100) without having to incorporate a large number of additional data paths into semiconductor chip 100.

Note that these data paths 121-130 include flip-flops to latch data values that are in transit between memory structures 104-106 and BIST engine 102. These flip-flops are represented by short lines that cross data paths 121-130. Note that data paths 121-130 carry addressing information as well as data and instruction information between BIST engine 102 and memory structures 104-106. This information is routed to memory structures 104-106 through multiplexers 134-136, respectively.

The process of testing memory structures 104-106 is described in more detail below with reference to FIG. 4.

Packet Formats

FIG. 2A illustrates the structure of a request packet 200 in accordance with an embodiment of the present invention. Request packet 200 includes a structure identifier 202, which identifies a specific memory structure (for example, the I-cache for processor core 3) within semiconductor chip 100. It also includes a sub-array identifier 204, which identifies a specific sub-array within the memory structure. It additionally includes an entry identifier (address) 206 which identifies an entry within the sub-array.

Request packet 200 also includes an operation specifier 208, which for example, specifies whether the operation is a read operation or a write operation. Finally, request packet 200 includes data 209 to be written to the memory location (if the request is for a write operation).

FIG. 2B illustrates the structure of a return packet 210 in accordance with an embodiment of the present invention. Return packet 210 contains much of the same information as the corresponding request packet, such as a structure identifier 212, a sub-array identifier 214, an entry identifier 216 and an operation specifier 218. Return packet 210 also include return data 209 if the corresponding request was for a read operation. Otherwise, if the corresponding request was for a write operation, the return data field 209 contains an acknowledgement for the write operation.

Test Patterns

FIG. 3A illustrates exemplary test patterns for testing memory structures in accordance with an embodiment of the present invention. As is illustrated in FIG. 3A, these patterns can include: all ones (FFFF); all zeros (0000); alternating ones and zeros (AAAA); and alternating zeros and ones (7777).

FIG. 3B illustrates exemplary sequences of memory operations for testing memory structures in accordance with an embodiment of the present invention. As is illustrated in FIG. 3B, these patterns can include: alternating reads and writes, $R_0$, $W_0$, $R_1$, $W_1$, $R_2$, $W_2$, and $R_3$, $W_3$, . . . , or back-to-back reads alternating with back-to-back writes, $R_0$, $R_1$, $R_2$, . . . , $W_0$, $W_1$, $W_2$, . . . .

Process of Testing Memory Structures

Figure 4:
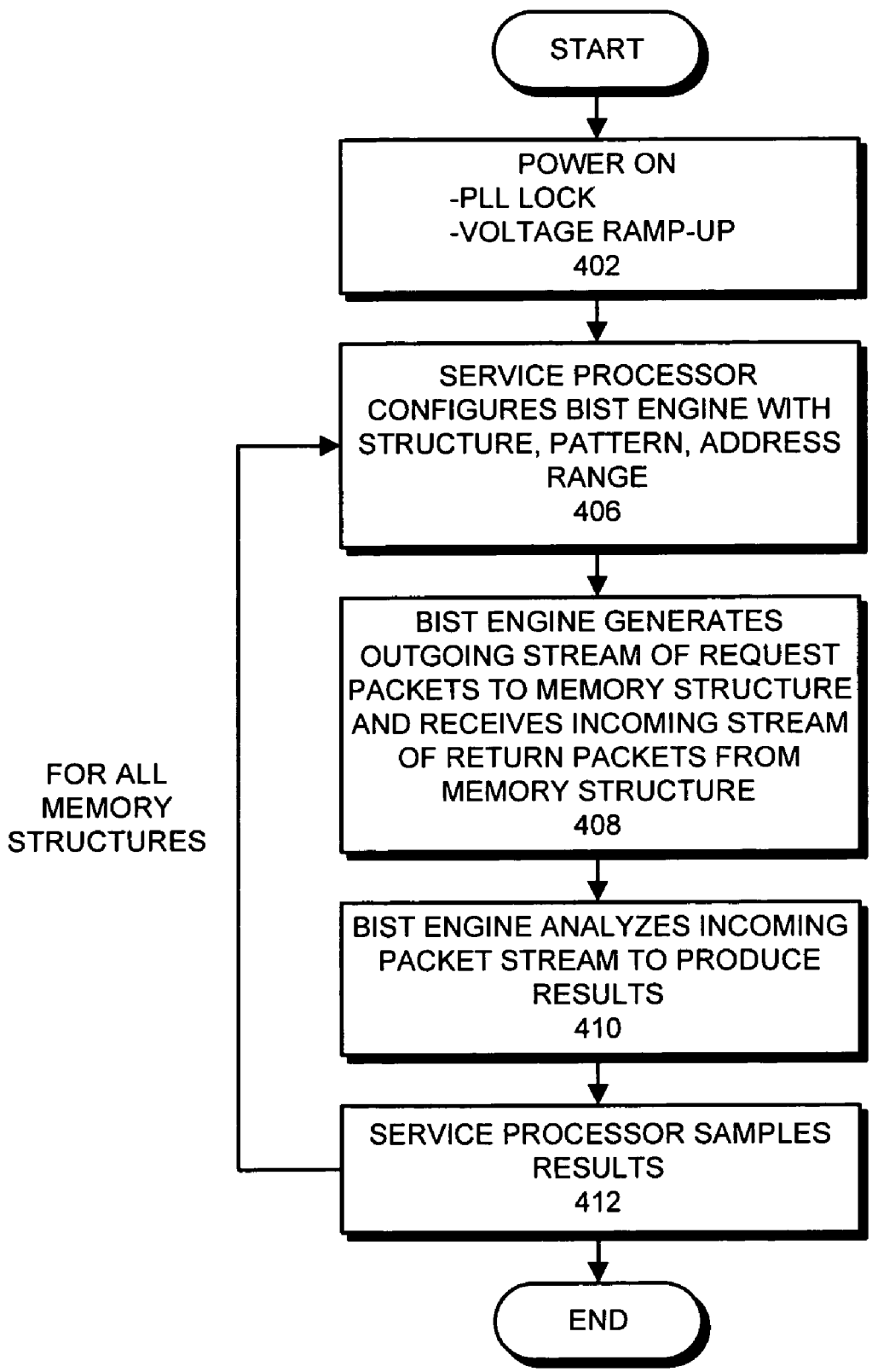
FIG. 4 presents a flow chart illustrating the process of testing on-chip memory structures in accordance with an embodiment of the present invention.

FIG. 4 presents a flow chart illustrating the process of testing on-chip memory structures. Process starts during a "power-on" sequence for semiconductor chip 100 (step 402). During this power-on sequence, a number of initialization operations take place, such as a PLL (phase-locked loop) locking operation and a voltage ramp-up operation.

Next, service processor 120 configures BIST engine 102 to test a specific structure, with a specific pattern and a specific address ranges (step 406). Note that this configuration can take place through: an existing data interface to semiconductor chip 100; through an existing JTAG interface; or through a special memory testing interface.

BIST engine 102 then generates an outgoing stream of request packets which are routed to the target memory structure. BIST engine 102 then waits for and receives an incoming stream of return packets from the target memory structure (step 408). Note that these request packets cause the target memory structure to perform at-speed data-parallel testing operations.

BIST engine 410 then analyzes the incoming stream of return packets with respect to the outgoing stream of request packets to produce test results (step 410). Service processor 120 then samples the test results (step 412).

Next, the system returns to step 406 to repeat steps 406, 408, 410 and 412 for all of the memory structures to be tested by BIST engine 102.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for using a built-in-self-test (BIST) engine to test multiple on-chip memory structures, comprising:

running the BIST engine, which is located on-chip, during an initialization process for the chip;

wherein running the BIST engine involves testing multiple on-chip memory structures which reside at different locations on the chip;

wherein testing the multiple on-chip memory structures involves performing at-speed data-parallel testing operations on the multiple on-chip memory structures; and wherein testing the multiple on-chip memory structures involves communicating with the multiple on-chip memory structures through pre-existing data paths which are used for other purposes during normal operation of the chip, but which are used for communications between the BIST engine and the multiple on-chip memory structures during the testing process.

2. The method of claim 1, further comprising using an external service processor to program the BIST engine to test the multiple on-chip memory structures;

wherein programming the BIST engine involves setting configuration registers for the BIST engine.

3. The method of claim 1, wherein the at-speed data-parallel testing operations involves:

writing a data pattern to a location in an memory structure;

reading the data pattern from the location in the memory structure; and comparing the data pattern read from the location with the data pattern written to the location to determine if an error took place while writing to or reading from the location.

4. The method of claim 1, wherein an on-chip memory structure in the multiple on-chip memory structures is:

an instruction cache;
a data cache;
a combined instruction and data cache;
a translation-lookaside buffer (TLB);
an instruction queue;
a branch history table (BHT); or
a memory structure containing speculative state information.

5. The method of claim 1, wherein the BIST engine is a state machine that performs read and write operations to the multiple on-chip memory structures.

6. An apparatus that uses a built-in-self-test (BIST) engine to test multiple on-chip memory structures, comprising:

a BIST engine, which is located on-chip and is configured to operate during an initialization process for the chip;

wherein the BIST engine is configured to test multiple on-chip memory structures which reside at different locations on the chip;

wherein the BIST engine is configured to perform at-speed data-parallel testing operations on the multiple on-chip memory structures; and wherein the BIST engine is configured to communicate with the multiple on-chip memory structures through pre-existing data paths which are used for other purposes during normal operation of the chip, but which are used for communications between the BIST engine and the multiple on-chip memory structures during the testing process.

7. The apparatus of claim 6, further comprising an external service processor configured to program the BIST engine to test the multiple on-chip memory structures;

wherein programming the BIST engine involves setting configuration registers for the BIST engine.

8. The apparatus of claim 6, wherein while performing the at-speed data-parallel testing operations, the BIST engine is configured to:

write a data pattern to a location in an memory structure;
read the data pattern from the location in the memory structure; and to
compare the data pattern read from the location with the data pattern written to the location to determine if an error took place while writing to or reading from the location.

9. The apparatus of claim 6, wherein an on-chip memory structure in the multiple on-chip memory structures is:

an instruction cache;
a data cache;
a combined instruction and data cache;
a translation-lookaside buffer (TLB);
an instruction queue;
a branch history table (BHT); or
a memory structure containing speculative state information.

10. The apparatus of claim 6, wherein the BIST engine is a state machine that performs read and write operations to the multiple on-chip memory structures.

11. A semiconductor chip including a built-in-self-test (BIST) engine to test multiple on-chip memory structures, comprising:

a BIST engine, which is located on the semiconductor chip and is configured to operate during an initialization process for the semiconductor chip;

wherein the BIST engine is configured to test multiple on-chip memory structures which reside at different locations on the semiconductor chip;

wherein the BIST engine is configured to perform at-speed data-parallel testing operations on the multiple on-chip memory structures; and wherein the BIST engine is configured to communicate with the multiple on-chip memory structures through pre-existing data paths which are used for other purposes during normal operation of the semiconductor chip, but which are used for communications between the BIST engine and the multiple on-chip memory structures during the testing process.

12. The semiconductor chip of claim 11, further comprising an interface for an external service processor through which the external service processor programs the BIST engine to test the multiple on-chip memory structures;

wherein programming the BIST engine involves setting configuration registers for the BIST engine.

13. The semiconductor chip of claim 11, wherein while performing the at-speed data-parallel testing operations, the BIST engine is configured to:

write a data pattern to a location in an memory structure;
read the data pattern from the location in the memory structure; and to
compare the data pattern read from the location with the data pattern written to the location to determine if an error took place while writing to or reading from the location.

14. The semiconductor chip of claim 11, wherein an on-chip memory structure in the multiple on-chip memory structures is:

an instruction cache;
a data cache;
a combined instruction and data cache;
a translation-lookaside buffer (TLB);
an instruction queue;
a branch history table (BHT); or
a memory structure containing speculative state information.

15. The semiconductor chip of claim 11, wherein the BIST engine is a state machine that performs read and write operations to the multiple on-chip memory structures.

16. A computer system including a built-in-self-test (BIST) engine to test multiple on-chip memory structures, comprising:
- a processor;
- a memory;
- a BIST engine, which is located on a semiconductor chip in the computer system and is configured to operate during an initialization process for the computer system;
- wherein the BIST engine is configured to test multiple on-chip memory structures which reside at different locations on the semiconductor chip;
- wherein the BIST engine is configured to perform at-speed data-parallel testing operations on the multiple on-chip memory structures; and
- wherein the BIST engine is configured to communicate with the multiple on-chip memory structures through pre-existing data paths which are used for other purposes during normal operation of the semiconductor chip, but which are used for communications between the BIST engine and the multiple on-chip memory structures during the testing process.

17. The computer system of claim 16, further comprising an interface for an external service processor through which the external service processor programs the BIST engine to test the multiple on-chip memory structures;
- wherein programming the BIST engine involves setting configuration registers for the BIST engine.

18. The computer system of claim 16, wherein while performing the at-speed data-parallel testing operations, the BIST engine is configured to:
- write a data pattern to a location in an memory structure;
- read the data pattern from the location in the memory structure; and to
- compare the data pattern read from the location with the data pattern written to the location to determine if an error took place while writing to or reading from the location.

19. The computer system of claim 16, wherein an on-chip memory structure in the multiple on-chip memory structures is:
- an instruction cache;
- a data cache;
- a combined instruction and data cache;
- a translation-lookaside buffer (TLB);
- an instruction queue;
- a branch history table (BHT); or
- a memory structure containing speculative state information.

20. The computer system of claim 16, wherein the BIST engine is a state machine that performs read and write operations to the multiple on-chip memory structures.

* * * * *